(12) United States Patent
Kumamoto

(10) Patent No.: US 7,145,226 B2
(45) Date of Patent: Dec. 5, 2006

(54) SCALABLE MICROELECTRONIC PACKAGE USING CONDUCTIVE RISERS

(75) Inventor: Takashi Kumamoto, Ibaraki-ken (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/610,854

(22) Filed: Jun. 30, 2003

(65) Prior Publication Data

US 2004/0262733 A1 Dec. 30, 2004

(51) Int. Cl.
*H01L 23/02* (2006.01)
*H01L 25/065* (2006.01)
*H05K 1/14* (2006.01)
*H05K 25/065* (2006.01)
*H05K 3/34* (2006.01)

(52) U.S. Cl. .............. 257/686; 257/E23.063; 257/E25.023; 257/723; 257/777; 257/778; 257/685; 257/737; 257/738; 257/784

(58) Field of Classification Search .......... 257/737, 257/738, 734, 777, 778, 686, 685, 723, 784, 257/E23.063, E25.023
See application file for complete search history.

(56) References Cited

U.S. PATENT DOCUMENTS

| | | | |
|---|---|---|---|
| 4,396,457 A | | 8/1983 | Bakermans |
| 5,123,163 A | | 6/1992 | Ishikawa et al. |
| 5,594,275 A | * | 1/1997 | Kwon et al. ............ 257/686 |
| 5,973,393 A | * | 10/1999 | Chia et al. ............ 257/690 |
| 6,072,233 A | | 6/2000 | Corisis et al. |
| 6,180,881 B1 | * | 1/2001 | Isaak ................ 174/52.4 |
| 6,476,476 B1 | * | 11/2002 | Glenn ................. 257/686 |
| 6,509,639 B1 | | 1/2003 | Lin |
| 6,538,312 B1 | | 3/2003 | Peterson et al. |
| 6,847,109 B1 | * | 1/2005 | Shim ................. 257/697 |
| 2001/0006258 A1 | | 7/2001 | Hur |
| 2001/0054758 A1 | * | 12/2001 | Isaak ................. 257/686 |
| 2002/0017710 A1 | * | 2/2002 | Kurashima et al. ....... 257/686 |
| 2002/0017727 A1 | | 2/2002 | Uemura |
| 2002/0053728 A1 | * | 5/2002 | Isaak et al. ........... 257/686 |
| 2002/0066952 A1 | * | 6/2002 | Taniguchi et al. ........ 257/698 |
| 2002/0135057 A1 | * | 9/2002 | Kurita ................ 257/685 |
| 2002/0135066 A1 | * | 9/2002 | Corisis et al. ........... 257/738 |
| 2003/0042564 A1 | * | 3/2003 | Taniguchi et al. ........ 257/438 |
| 2003/0062612 A1 | * | 4/2003 | Matsuo et al. .......... 257/686 |
| 2003/0073266 A1 | | 4/2003 | Takahashi et al. |
| 2003/0111722 A1 | * | 6/2003 | Nakao ................ 257/686 |
| 2003/0164540 A1 | * | 9/2003 | Lee et al. ............. 257/686 |
| 2003/0168254 A1 | * | 9/2003 | Kariya et al. ............ 174/261 |
| 2004/0058472 A1 | * | 3/2004 | Shim ................. 438/108 |
| 2004/0125574 A1 | * | 7/2004 | Yoon ................. 361/735 |
| 2005/0085034 A1 | * | 4/2005 | Akiba et al. ............ 438/232 |

FOREIGN PATENT DOCUMENTS

JP 2003-31768 * 1/2003

* cited by examiner

*Primary Examiner*—Alexander Oscar Williams
(74) *Attorney, Agent, or Firm*—Schwabe, Williamson & Wyatt, P.C.

(57) ABSTRACT

This invention relates to an apparatus and methods for increasing the microelectronic package density by stacking multiple microelectronic packages in an array and controlling package to package scalability without stressing the carrier substrates and without limiting the number of signal and input/output leads. Specifically, an intermediate substrate having conductive risers therein is used to enable pitch control of the package to package interconnection, control of the standoff distance and act as a microelectronic package stiffener.

16 Claims, 4 Drawing Sheets

SCALABLE MICROELECTRONIC PACKAGE USING CONDUCTIVE RISERS

FIELD OF THE INVENTION

The present invention relates to microelectronic packaging, and more particularly to stacking microelectronic packages in an array to increase packaging density.

BACKGROUND OF INVENTION

Trends in microelectronic devices are toward increasing miniaturization, circuit density, operating speeds and switching rates. These trends have directly impacted the complexity associated with the design and manufacture of microelectronic dice, microelectronic devices, which include the microelectronic die and a substrate, microelectronic packages, as well as computing devices in general. Examples of computing devices include, but are not limited to servers, personal computers and "special" purpose computing devices. Personal computers may have form factors, such as desktop, laptop, tablet, and the like. "Special" purpose computing devices may include set top boxes, personal digital assistants, wireless phones, and the like.

In particular, attention has increasingly shifted to microelectronic packaging as a means to meet the demands for enhanced system performance. As shown in FIG. 4, current microelectronic packages typically consist of a microelectronic die 50 electrically interconnected to a carrier substrate 52, which are commonly encapsulated with an encapsulation material 54, such as molded plastic, epoxy or other suitable materials. Additional components, including but not limited to a heat dissipation device, may be included as part of the microelectronic package.

As demand increases, it has become necessary to use multiple dice that work in conjunction with one another. When using multiple dice, however, it becomes critical to position the dice close together since excessive signal transmission distance deteriorates signal integrity and propagation times. The use of conventional single-die microelectronic packages, however, is not commensurate with the need to shorten signal transmission distance because they typically have an area (or footprint) many times larger than the area of the die. This not only increases transmission distances, but it also decreases packaging density.

One solution to create higher density packaging, reduce area requirements and shorten signal transmission distances has been to vertically stack and electrically interconnect multiple dice in a single microelectronic package. Another solution has been to stack multiple microelectronic packages, such as ball grid arrays (BGA) and chip scale packages (CSP) in an array. Although these stacked microelectronic packages provide certain advantages, further size reduction and performance enhancement has been difficult to obtain due to the physical dimension, design and manufacturing constraints of the individual microelectronic packages and the interconnection to the other microelectronic packages in the array.

FIG. 5 shows one assembly known in the art wherein multiple single-die microelectronic packages, as shown and described in FIG. 4 are stacked in an array. Each carrier substrate 52 has multiple conductive land pads 56 at the die side 60 of the carrier substrate 52 that are electrically interconnected to conductive traces (not shown) within the carrier substrate 52. Land pads 56 include but are not limited to conductive pads, through holes, vias, and any other structure adapted for electrical interconnection. When stacked, the land pads 56 are positioned for electrical communication with respective bond pads 56' on the non-die side 62 of carrier substrate 52 of the adjacent microelectronic package. An interconnect 58, such as solder, is used to electrically interconnect the land pads 56 of one microelectronic package to the bond pads 56' of another microelectronic package.

A number of problems exist with stacking prior art microelectronic packages. One, it limits package-to-package interconnect scalability, which involves varying the interconnect pitch (distance between center points of the conductive pads) without changing the gap in between packages. For a fine pitch interconnect, the conductive interconnect 58 must be decreased so as not to bridge with adjacent interconnects. However, it is important to keep appropriate standoff distance from one microelectronic package to another in order to accommodate the die, encapsulation material, and other components, if used. To maintain this standoff distance, the interconnect 58 must be of a sufficient quantity, which limits decreasing the pitch. Decreasing the pitch, however is necessary to keep up with the advancements in microelectronic packages, as more input/output signal leads and power leads are required.

Another problem with stacking microelectronic packages is that the package carrier substrate 52, especially the carrier substrate at the bottom of the stack, commonly is subjected to increased stress and flexing. The flexing of the carrier substrate is undesirable because it tends to result in open connections, reduces the microelectronic package effectiveness, and leads to microelectronic package failure.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Figure 1:
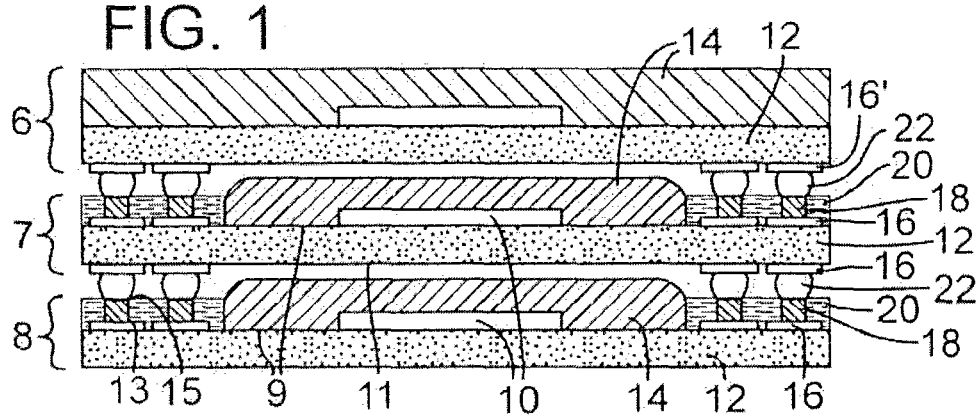
FIG. 1 is a side cross-sectional view of an array of microelectronic packages in accordance with one embodiment of the present invention.

FIG. 1 is a side cross sectional view of an array of microelectronic packages in accordance with an embodiment of the present invention. First microelectronic package 8 comprises a microelectronic die 10 electrically interconnected with a carrier substrate 12. Die 10 is encased in an encapsulation material 14, a common practice in the art. It can be appreciated by one skilled in the art, however, that encapsulation material 14 is provided for a particular purpose, and in other embodiments is not required or provided (i.e. optional). See, for example, FIG. 7. Suitable encapsulation materials include, but are not limited to, molded plastic, resins and epoxies.

Carrier substrate 12 of first microelectronic package 8 has land pads 16 exposed at a die side 9 of carrier substrate 12, outside the periphery of the die 10 and encapsulation material 14. It is understood in the art that land pads is a term for referring to pads, plated through holes, or any other structure that allows for electrical communication between the carrier substrate circuitry and an attached component.

Intermediate substrate 20 can be coupled or laminated to the carrier substrate 12, such that it encompasses the periphery of die 10 and encapsulation material 14. Intermediate substrate 20 comprises a variety of dielectric materials, including but not limited to C-stage thermoset polymer resins, epoxies, and the like. In other embodiments that do not include encapsulation material 14, the intermediate substrate 20 can encompass the periphery of die 10, or it may have a cavity that is sized to accommodate the die volume such that it covers die 10.

Intermediate substrate 20 has a plurality of conductive risers 18 disposed therein. Conductive risers 18 have a first end 13 and a second end 15, and are in relative alignment such that the first end 13 may be in electrical communication with land pads 16 of carrier substrate 12. The second end 15 of conductive risers 18 are also positioned to enable electrical interconnection with bond pads 16' of adjacent second microelectronic package 7. Conductive risers 18 may reduce the size of interconnects 22 needed for electrical interconnection, which may allow for a finer pitch in land pads 16 and bond pads 16'. Conductive risers 18 comprise a variety of conductive materials, including, but not limited to, copper, gold, nickel, and various other metals and metal alloys.

Second microelectronic package 7 can be positioned adjacent to microelectronic package 8. Microelectronic package 7 is substantially the same as first microelectronic package 8, and comprises a microelectronic die 10 encased in encapsulation material 14 that is electrically interconnected to a carrier substrate 12. Carrier substrate 12 of second microelectronic package 7 further comprises land pads 16 on the die side 9 and bond pads 16' on the non-die side 11. It is understood in the art that bond pads is a term for referring to pads, plated through holes, or any other structure that allows for electrical communication between the carrier substrate circuitry and an attached component.

Bond pads 16' are positioned for relative alignment and electrical interconnection with the second end 15 of conductive risers 18 disposed in the intermediate substrate 20 of the first microelectronic package 8. Interconnects 22 electrically interconnect conductive risers 18 with bond pads 16'. Interconnects 22 comprise a conductive material including, but not limited to, leaded solder, lead-free solder, conductive or conductor-filled epoxy, and other conductive substances known to those skilled in the art. Second microelectronic package 7 also comprises intermediate substrate 20, having conductive risers 18 disposed therein, in much the same way as discussed above with regard to the intermediate substrate 20 for first microelectronic package 8.

Third microelectronic package 6 may be positioned adjacent to second microelectronic package 7. Microelectronic package 6 also is substantially the same as first microelectronic package 8, and comprises a microelectronic die 10 encased in encapsulation material 14 that is electrically interconnected to a carrier substrate 12. Carrier substrate 12 of third microelectronic package 6 comprises bond pads 16' on the non-die side 11 of carrier substrate 12. Bond pads 16' of third microelectronic package 6 are positioned for relative alignment and electrical interconnection with the conductive risers 18 of the intermediate substrate 20 of second microelectronic package 7. Interconnects 22 electrically interconnect conductive risers 18 with bond pads 16' of the third microelectronic package 6.

In addition to the stacked array of three microelectronic packages 8,7,6, as illustrated in FIG. 1, other embodiments of stacked arrays in accordance with the present invention may have more or fewer microelectronic packages in the array. Also, intermediate substrate 20 can be secured to carrier substrate 12 such that it may act as a stiffener to increase the rigidity of a microelectronic package, which helps prevent flex in the intermediate substrate 20, thereby reducing the potential for open circuits leading to flex-induced interconnect failure. This can reduce the manufacturing costs of microelectronic packages, where in the past, the use of various stiffeners to prevent carrier substrate flex was required. Additionally, the use of the conductive risers 18 may also allow for fine pitch package-to-package interconnection scalability because the height required to clear the adjacent microelectronic package is no longer constrained by interconnects 22, but rather may be dependent on the height and width of the conductive risers 18.

Figure 2:
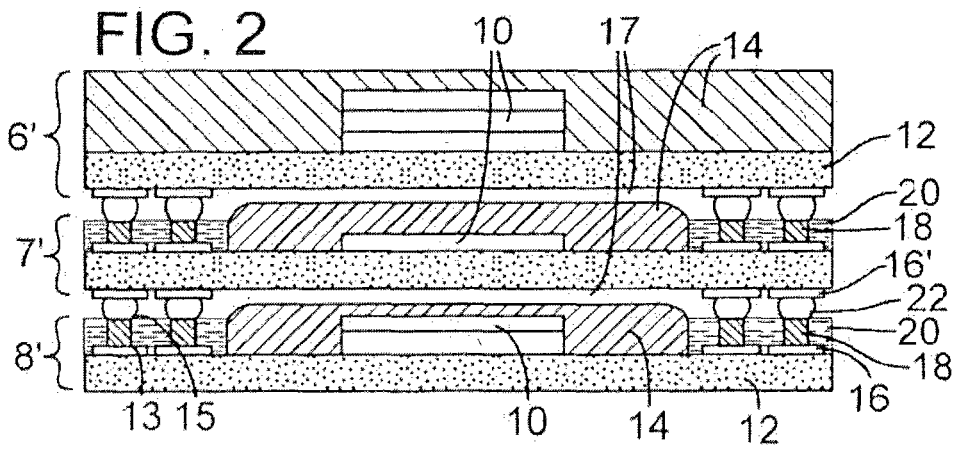
FIG. 2 is a side cross-sectional view of an array of microelectronic packages in accordance with another embodiment of the present invention.

FIG. 2 is a side cross sectional view of an array of microelectronic packages in accordance with an embodiment of the present invention. The stacked array comprises multiple microelectronic packages each having one or more stacked microelectronic dice. First microelectronic package 8' has many of the same elements as first microelectronic package 8 as described with respect to FIG. 1. The conductive risers 18' of first microelectronic package 8', however, are slightly elongated in order to accommodate increased package height caused by the additional microelectronic dice 10. The conductive risers 18' may help to maintain the package to package scalability without increasing the pitch of the land pads 16 or bond pads 16'. Likewise, the conductive risers 18 of second microelectronic package 7' can be adapted to provide a predetermined standoff height for the third microelectronic package 6', again without affecting package to package scalability.

The gap height 17 between microelectronic packages may be adjusted for a variety of reasons, including but not limited to the microelectronic package thickness. Adjustment to the gap height may help accommodate additional components such as heat spreaders (not shown), provide a required standoff distance, or increase the pitch of the microelectronic packages without increasing the interconnect 22.

Figure 3A:
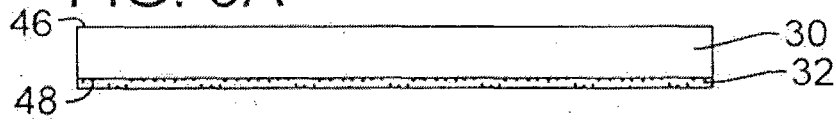
FIGS. 3A–3C are side cross-sectional views showing a process for manufacturing a microelectronic package in accordance with one embodiment of the present invention.
Figure 3B:
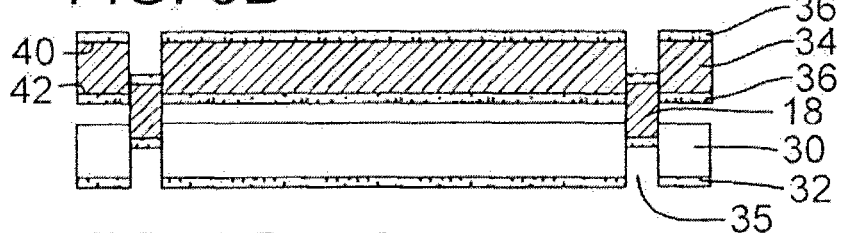
Figure 3C:
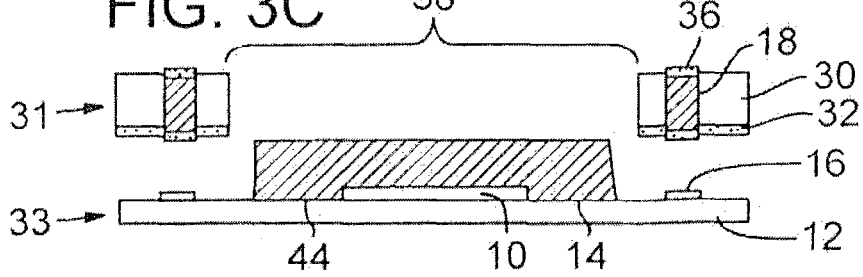
Figure 4:
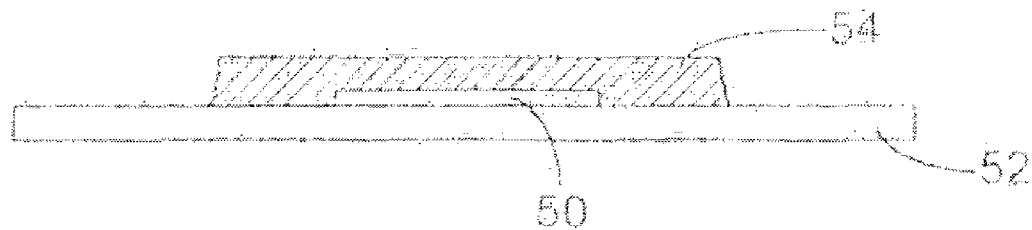
FIG. 4 is a side cross sectional view of a known singe-die microelectronic package.
Figure 5:
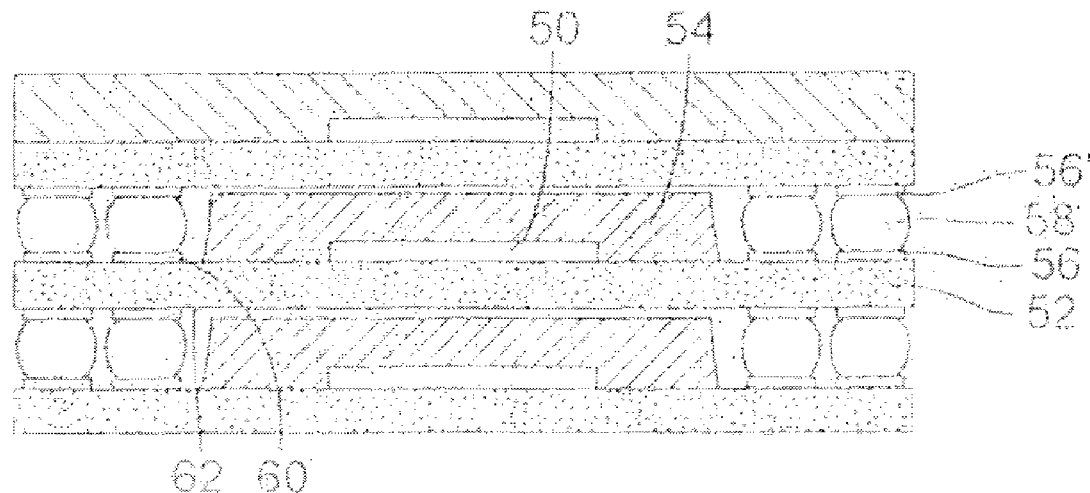
FIG. 5 is a side cross sectional view of a known array of microelectronic packages.

FIGS. 3A–3C are side cross-sectional views of a method of fabricating a microelectronic package adapted for use in a stacked array in accordance with an embodiment of the present invention. FIG. 3A illustrates an intermediate substrate blank 30 of a predetermined size that has a first side 46 and a second side 48. Adhesive layer 32 can be applied to the second side 48 of intermediate substrate blank 30. Intermediate substrate blank 30 can be made out of variety of dielectric materials. As previously discussed with regard to intermediate substrate 20 in FIG. 1, one example is the use of a C-stage thermoset polymer resin for intermediate substrate 30 and a B-stage thermoset polymer resin for adhesive layer 32. Use of C-stage and B-stage resins are known in the are; and can be done in a variety of ways.

The substrate blank material may be application dependent, such as to provide a predetermined material stiffness, and/or control the coefficient of thermal expansion (CTE). Thus, other suitable dielectric materials for intermediate substrate blank 30 may include, but are not limited to polymer matrix composites, such as glass cloth reinforced polymer.

FIG. 3B is a cross sectional view of the manufacturing process, where the conductive riser 18 may be inserted into an accommodating aperture 35 in substrate blank 30, in accordance with one embodiment. Conductive material 34, having a predetermined thickness, comprises a conductive plating 36 applied to the first end 40 and second end 42 of conductive material 34. Conductive plating 36 enables electrical interconnection with land pads 16 of carrier substrate 12 (shown in FIG. 3C) and bond pads 16' (not shown) of an adjacent microelectronic package. Suitable materials for conductive plating 36 include, but are not limited to, electrolytic tin plating and lead or lead-free solder.

Conductive riser 18 can be removed from conductive material 34 using, for example, a punch and die process. Aperture 35 in intermediate substrate blank 30 can be formed by a similar process. As conductive riser 18 is being punched out of conductive material 34, it can be accordingly pressed into aperture 35. Conductive riser 18 and aperture 35 may be created by other techniques, including but not limited to, drilling, augering, laser etching or inserting the conductive material 34 into aperture 35 in a non-solid phase and curing to a solid phase.

It is desirable for the overall thickness of the conductive material 34 and the conductive plating 36 to be the same as or greater than the thickness of the intermediate substrate blank 30', including adhesive layer 32, such that a portion of the conductive plating 36 is flush with or protrudes slightly above and below the surfaces of the intermediate substrate blank 30 and adhesive layer 32, when inserted in aperture 35. A slight protrusion allows the conductive riser 18 to electrically interconnect with land pads 16 and bond pads 16' (not shown) when the intermediate substrate 30 is secured to the microelectronic package carrier substrate 12, for example, during the hot press process, or during a reflow process. In other embodiments, conductive risers 18 are formed from a conductive material 34 without conductive plating 36. Conductive plating can be pre-positioned on the land pads 16 and bond pads 16' such that electrical interconnection is made during a reflow process or the hot press process.

FIG. 3C is a cross-sectional view of an intermediate substrate fabrication process in accordance with an embodiment of the present invention. Second aperture 38 may be formed in intermediate substrate blank 30, which in turn may form the intermediate substrate 31. Second aperture 38 enables intermediate substrate 31 to over lay carrier substrate 12, accommodating the size and shape of the microelectronic die 10 and, optionally encapsulation material 14. Intermediate substrate 31 may be placed the die side 44 of carrier substrate 12 of microelectronic package 33, such that the conductive plating 36 of the conductive risers 18 are in electrical communication with corresponding land pads 16. As previously discussed, in another embodiment conductive plating 36 can be pre-positioned on land pad 16 and not on conductive riser 18.

Intermediate substrate 31 may be coupled to microelectronic package 33 by using a suitable processes, depending on the material used for adhesive layer 32. In one embodiment wherein the adhesive layer 32 is a B-stage resin, a hot press process may be used to secure intermediate substrate 31 to carrier substrate 12. The hot press process may help to ensure an electrical/mechanical bond between land pads 16 and conductive risers 18 by causing conductive plating 36 to flow and cure.

In one embodiment, using a C-Stage resin for intermediate substrate blank 30 and a B-stage resin for adhesive layer 32, a vacuum can be applied such that the pressure within the chamber is less than about 10 kilo Pascals. Heat and pressure can then be applied to bond carrier substrate 12 and intermediate substrate 31, as well as electrically/mechanically bond land pads 16 to the corresponding conductive risers 18. Applying a pressure about between 0.5–10 mega Pascals at a temperature about between 150–350 degrees Celsius may provide acceptable lamination of the intermediate substrate 31 to carrier substrate 12, and accordingly may act as a package stiffener. Further, this may help to ensure electrical interconnection between land pads 16 and conductive risers 18. It can be appreciated that the pressure and temperature of the hot press may be varied depending on the curing properties of adhesive layer 32 and, if used, the conductive plating 36.

Figure 6:
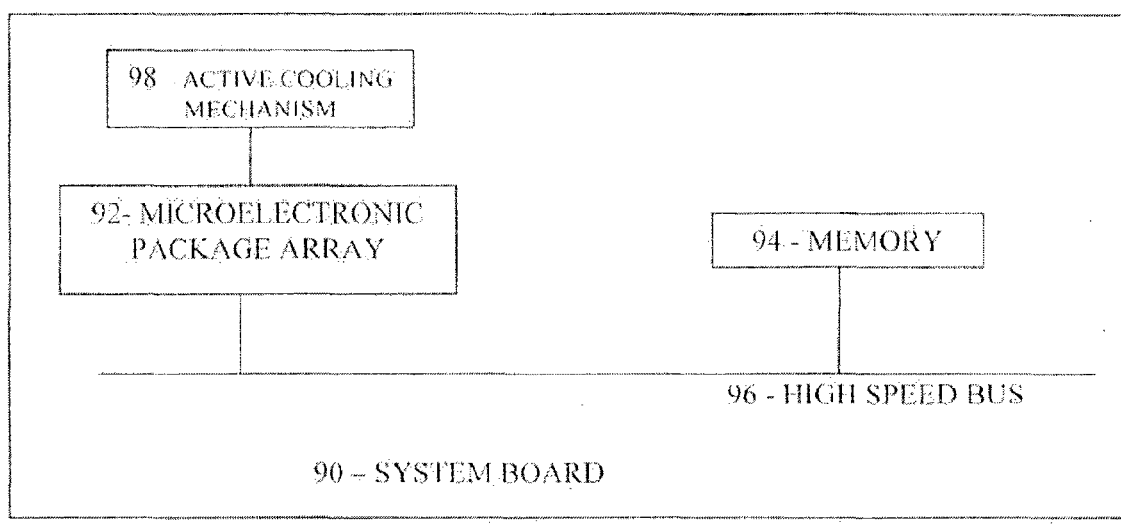
FIG. 6 is an example system suitable for practicing the present invention in accordance with one embodiment.

FIG. 6 is an example system suitable for practicing one embodiment of the present invention. A microelectronic package array 92 of the present invention is coupled to system board 90 through high speed bus 96. System board 90 may be a carrier substrate, such as a motherboard or other printed circuit boards. As shown, the system board 90 also includes a memory 94 configured to store data, coupled to the system board 90 through high speed bus 96. Memory 94 may include but is not limited to dynamic random access memory (DRAM), synchronous DRAM (SDRAM), and the like. In the embodiment shown, an active cooling mechanism 98 is coupled to the microelectronic package array 92 to help keep the microelectronic package 92 from overheating. Active cooling mechanism may include, but is not limited to fans, blowers, liquid cooling loops and the like.

Figure 7:
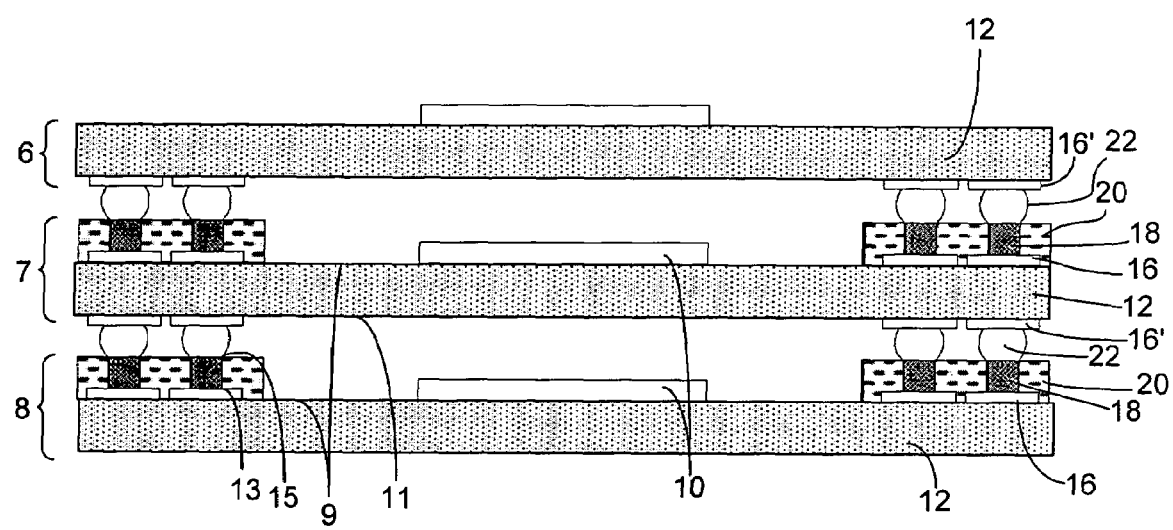
FIG. 7 is a side cross-sectional view of an array of microelectronic packages in accordance with yet another embodiment of the present invention.

FIG. 7 is a side cross sectional view of an array of microelectronic packages in accordance with another embodiment of the present invention. As depicted, the array includes all of the same components as the array depicted in FIG. 1 except that the dice 10 are not encapsulated by encapsulation material 14.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A microelectronic package, comprising:
   a carrier substrate, the carrier substrate having a die side and a non-die side, the die side having a first area for electrically interconnecting a die to the die side of the carrier substrate, and a second area having land pads on the die side of the carrier substrate, the land pads having a predetermined pitch;
   a die coupled to the first area; and an intermediate substrate directly laminated to the die side of the carrier substrate, the intermediate substrate located outside the periphery of the first area and that does not encapsulate the die, the intermediate substrate having conductive risers disposed therein corresponding to the land pads, the conductive risers configured to cooperate with the corresponding land pads to provide a standoff distance sufficient to accommodate the die, and each of the conductive risers having a first end and a second end, the first end being electrically interconnected to the land pad.

2. The microelectronic package of claim 1, wherein the conductive risers comprises substantially oxygen-free copper.

3. The microelectronic package of claim 1, further comprising conductive plating on the first ends of the conductive risers.

4. The microelectronic package of claim 3, wherein the conductive plating is selected from a group including leaded solder, lead-free solder and tin.

5. The microelectronic package of claim 1, wherein the intermediate substrate is laminated to the die side of the carrier substrate of the microelectronic package.

6. A microelectronic package array, comprising:
a first microelectronic package having a first carrier substrate, the first carrier substrate having a die side and a non-die side, the die side having a first area for electrically interconnecting a die to the die side of the carrier substrate, and a second area having land pads on the die side of the carrier substrate, the land pads having a predetermined pitch;
a die coupled to the first area;
an intermediate substrate directly laminated to the die side of the carrier substrate, the intermediate substrate located outside the periphery of the first area and that does not encapsulate the die, the intermediate substrate having conductive risers disposed therein corresponding to the land pads, the conductive risers configured to create a standoff distance sufficient to accommodate the first die and one or more additional components without affecting the predetermined pitch, and each of the conductive risers having a first end and a second end, the first end being electrically interconnected to the land pads; and
a second microelectronic package having a second carrier substrate, the second carrier substrate having a die side and a non-die side, the die side having a first area for electrically interconnecting a die to the die side of the second carrier substrate, and a second area having bond pads on the non-die side, the bond pads being electrically interconnected to the second end of the conductive risers.

7. The microelectronic package array of claim 6, wherein the conductive risers comprise oxygen-free copper.

8. The microelectronic package array of claim 6, further comprising conductive plating on the first ends of the conductive risers.

9. The microelectronic package of claim 8, wherein the conductive plating is selected from a group including leaded solder, lead-free solder and tin.

10. The microelectronic package array of claim 6, further comprising interconnects electrically coupling the bond pads to the second ends of the corresponding conductive risers of the first microelectronic package.

11. The microelectronic package array of claim 10, wherein the interconnects comprise lead free solder.

12. A microelectronic package, comprising:
a carrier substrate, the carrier substrate having a die side and a non-die side, and a plurality of land pads disposed on the die side of the carrier substrate, the land pads having a predetermined pitch;
a die electrically interconnected to the die side of the carrier substrate; and
an intermediate substrate directly laminated to the die side of the carrier substrate, the intermediate substrate located outside the periphery of the die and that does not encapsulate the die, the intermediate substrate having a plurality of conductive risers disposed therein, the conductive risers adapted to cooperate with the land pads to provide a clearance height sufficient to accommodate the die and at least one other component.

13. The microelectronic package of claim 12, wherein the at least one other component is selected from a group consisting of heat spreaders, active cooling devices, encapsulates, and additional dice.

14. The microelectronic package of claim 1, wherein said die is not encapsulated with an encapsulating material.

15. The microelectronic package array of claim 6, wherein said die is not encapsulated with an encapsulating material.

16. The microelectronic package of claim 12, wherein said die is not encapsulated with an encapsulating material.

* * * * *

UNITED STATES PATENT AND TRADEMARK OFFICE
CERTIFICATE OF CORRECTION

PATENT NO.          : 7,145,226 B2                                          Page 1 of 1
APPLICATION NO. : 10/610854
DATED               : December 5, 2006
INVENTOR(S)        : Takashi Kumamoto It is certified that error appears in the above-identified patent and that said Letters Patent is hereby corrected as shown below:

Column 4
Lines 38-39 & 42, "... conductive risers 18'...." should read -- ... conductive risers 18 ... --.

Column 5
Lines 34-35, "... intermediate substrate blank 30',...." should read -- ... intermediate substrate blank 30, ... --.
Line 41, "... intermediate substrate 30 ..." should read -- ... intermediate substrate 31 ... --.

Column 7
Lines 12-13, "... the conductive risers comprises ..." should read -- ... the conductive risers comprise ... --.

Signed and Sealed this

Fourth Day of November, 2008

JON W. DUDAS
*Director of the United States Patent and Trademark Office*